United States Patent [19]

Imamura et al.

[11] Patent Number: 4,716,489
[45] Date of Patent: Dec. 29, 1987

[54] BREAKDOWN PROTECTED PLANAR TRANSISTOR DEVICE

[75] Inventors: Kaoru Imamura; Kenichi Muramoto, both of Kawasaki, Japan

[73] Assignee: Kabushiki Kaisha Toshiba, Kawasaki, Japan

[21] Appl. No.: 813,841

[22] Filed: Dec. 27, 1985

[30] Foreign Application Priority Data

Dec. 28, 1984 [JP] Japan .................. 59-279937

[51] Int. Cl.$^4$ ............................................ H02H 3/20
[52] U.S. Cl. ........................................ 361/91; 361/93; 361/101; 330/207 P
[58] Field of Search ............... 361/86, 87, 91, 93, 361/98, 101; 330/298, 207 P; 357/43, 22 G

[56] References Cited

U.S. PATENT DOCUMENTS

| | | | |
|---|---|---|---|
| 3,336,503 | 8/1967 | White | 361/101 X |
| 3,601,625 | 8/1971 | Radwine et al. | 357/43 X |
| 3,970,869 | 7/1976 | Coats, Jr. | 361/98 X |
| 3,989,962 | 11/1976 | Takagi et al. | 361/101 X |
| 3,992,650 | 11/1976 | Iwasa et al. | 361/91 X |
| 4,355,341 | 10/1982 | Kaplan | 330/207 P X |
| 4,400,711 | 8/1983 | Avery | 357/43 |
| 4,495,536 | 1/1985 | Bynum | 361/91 |

Primary Examiner—A. D. Pellinen
Assistant Examiner—Derek S. Jennings
Attorney, Agent, or Firm—Banner, Birch, McKie & Beckett

[57] ABSTRACT

A protection circuit is provided for a planar transistor device. The protection circuit comprises a variable resistor device formed of a junction type field effect transistor. The resistor device is connected in series with the base of the planar transistor. The drain electrode of the J-FET is connected to the base of the planar transistor while the collector of the planar transistor is connected to the gate of the J-FET. Due to this interconnected scheme, base input resistance of the planar transistor is increased to reduce its base current when a high voltage is applied accidentally to the collector. The base current is not eliminated, however, and the device is protected but can still operate.

9 Claims, 5 Drawing Figures

BREAKDOWN PROTECTED PLANAR TRANSISTOR DEVICE

BACKGROUND OF THE INVENTION

The present invention relates to a large power semiconductor device having a self-protection feature. In particular, the invention is directed to a large power switching transistor device provided with a junction type field effect transistor (J-FET) acting as a protection circuit.

Recently, great progress has been achieved in the fields of variable motor control and automatic control of various machines. Also, the industry has witnessed the advent of power transistors with greater breakdown voltages. As a result, the demand for large power switching transistors such as a Darlington transistor is sharply increasing. Under the circumstances, it is a serious concern in this field to develop large power switching transistors having a high breakdown voltage while permitting the use of a relativley high voltage (e.g., 480 volts AC), and operating over a wide area of safety operation (ASO). ASO is the range of Vce voltages which can be applied to the transistor without a breakdown occurring.

If an accident occurs during the operation of a large power switching transistor (e.g., load short-circuiting, power surges, power source fluctuation etc.), a high voltage is applied between the collector and the emitter of the transistor. A large current will suddenly flow through the transistor and the transistor will be instantly destroyed. As a result, it is customary in the prior art to provide large power switching transistors with a protection circuit for protecting the transistor from destruction in the event of an accident. Such prior art circuits substantially increase the ASO during that time. It should be noted that the ASO will decrease in proportion to the continuous time the transistor is operating. Thus, it is necessary to provide some method in the prior art to prevent or limit breakdown as the transistor continues to operate.

FIG. 1 shows a conventional protection system for a power transistor Q1. A protective switch Q2, operable by the collector voltage of Q1, is connected between the base and emitter of Q1. When an excess voltage is applied between the collector and emitter of Q1, protective switch Q2 is turned on to short-circuit the base and emitter of transistor Q1. As a result, an excess collector current is prevented from flowing, thereby preventing the destruction of transistor Q1.

FIG. 2 is a graph showing the static characteristics of transistor Q1 and its protective switch Q2. The collector-emitter voltage $V_{CE}$ of Q1 is plotted on the abscissa, while the collector current $I_C$ is plotted in the ordinate. $A_1$ to $A_3$ represent the change of $I_C$ relative to $V_{CE}$ for each base current $I_B$. Straight line b-b' represents the load characteristics; point b denotes the conductive state of the transistor and the point b' denotes its nonconductive state. The curves represented by the dashed lines show the characteristics of a transistor Q1 which has not been provided with a protective switch such as switch Q2.

The conventional protection system described above utilizes protective switch Q2 to force transistor Q1 into the cut off region (i.e., values of $V_{CE}$ greater than or equal to $V_{CO}$-FIG. 2). This system, however, is defective since at $V_{CE}$ voltage values above $V_{CO}$, transistor Q1 does not operate. As seen from FIG. 2, curves $A_1$–$A_3$ have collector current ($I_C$) values equal to zero above $V_{CE}$ voltage values greater than $V_{CO}$. Therefore, it is difficult, if not impossible, to operate transistor Q1 at point b or other non-zero collector current values because switch Q2 is constantly on and collector current $I_C$ is thereby prevented from flowing.

In order to permit Q1 to pass some collector current while switch Q2 is operating, it is necessary to set the bias point b'' within the narrow range R. In particular, b'' must be set between the operating points $R_1$ and $R_2$. $R_1$ represents the value of $V_{CE}$ which provides some collector current for all curves $A_1$–$A_3$. $R_2$ represents the lowest value of $V_{CE}$ where breakdown occurs.

In order to set the bias point b'' in this fashion, the power source voltage for driving the transistor must be determined by the static characteristics of the transistor device including the protective switch Q2. As a result, a substantial and practical restriction is imposed on the setting of the power source voltage. In addition, since the operating characteristics vary among the individual protective circuits, the setting for the source voltage must be changed for each transistor. Thus, it is very difficult to design the power source circuit. Additional difficulty is presented since the bias voltage must be sufficiently stabilized in order to enable the protective circuit to operate normally despite the existence of source voltage fluctuations. It is extremely difficult, however, to stabilize the bias voltage due to the fluctuations.

SUMMARY OF THE INVENTION

An object of the present invention is to provide a novel transistor device capable of protecting itself from breakdown in the event of accidents, such as load short-circuiting.

More specifically, the present invention is intended to provide a large power switching transistor device with appropriate breakdown protection, whereby the transistor is not driving into the cut off region despite the occurrences of surge voltage (e.g., load short-circuiting). Thus, the device is protected from destruction, and the power source voltage needed for driving the transistor is not restricted by the protective circuit.

The present invention utilizes a variable resistor element having the same construction as a junction type field effect transistor (J-FET). This resistor element is connected in series with the base (i.e., input stage) of a planar bipolar transistor. The drain electrode of the J-FET is electrically connected to the base region of the bipolar transistor while the collector of the bipolar transistor is also the gate of the J-FET. Due to this interconnected scheme, base input resistance of the transistor is increased to reduce its base current when a high voltage is applied to its collector during short-circuiting of the load. The base current, however, is not reduced to zero; thus, the transistor is not turned off, although it is protected from the high voltage. In short, the present invention provides a large power switching semiconductor device with breakdown protection capability in the event of load short-circuiting. Particularly, the breakdown protected transistor in accordance with the instant invention is not influenced by power source voltage fluctuations whereby it can be operated at any power source voltage provided the voltage is within the safe operation range.

DETAILED DESCRIPTION OF THE PREFERRED EMBODIMENTS

Figure 1:
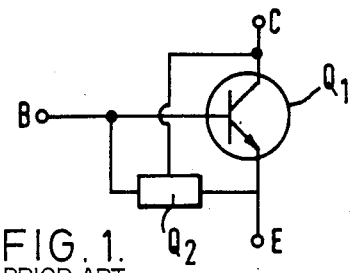
FIG. 1 shows a conventional circuit including a transistor provided with a protective switch.
Figure 2:
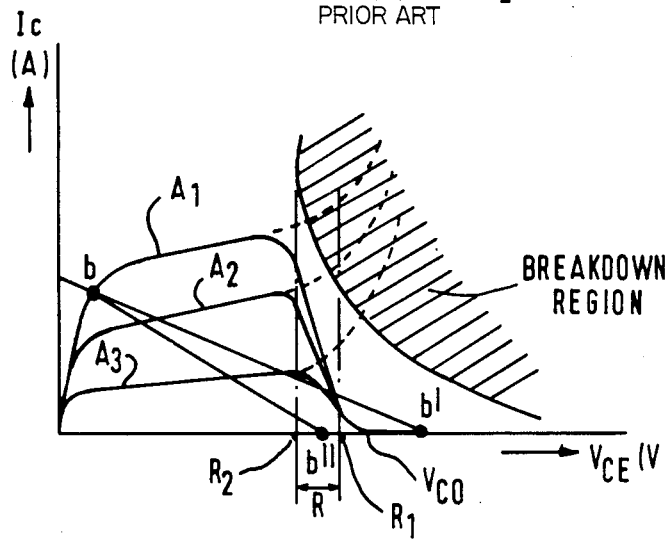
FIG. 2 shows the static characteristics of the transistor circuit with a conventional protective switch of FIG. 1.
Figure 3:
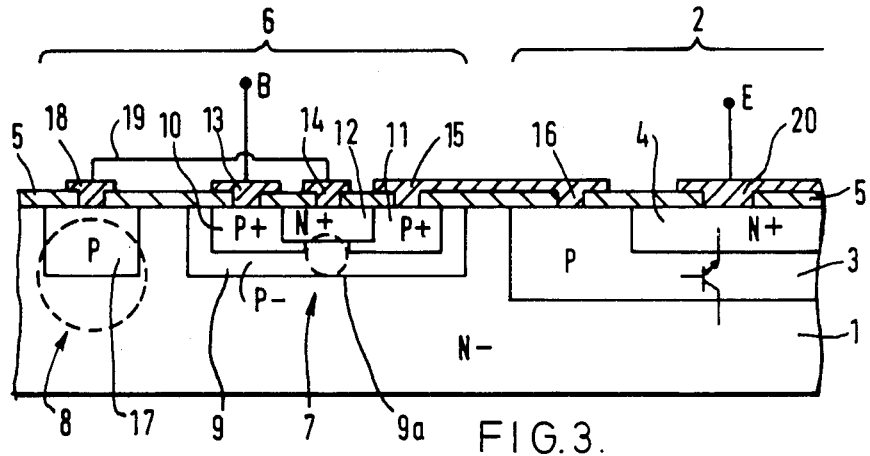
FIG. 3 is a cross sectional view showing a semiconductor device according to one embodiment of the present invention.

FIG. 3 is a cross sectional view showing a transistor device according to one embodiment of the present invention. The transistor device comprises an n-type semiconductor substrate 1 having a low impurity concentration. Substrate 1 acts as the collector region of a planar bipolar transistor 2 and as a first gate region of a junction type field effect transistor 7 formed in the substrate. Reference numerals 3 and 4 shown in FIG. 3 denote the base and emitter regions of bipolar transistor 2, respectively; their conductivity type and impurity concentration are also shown. An oxide film 5 overlaps base and emitter regions 3 and 4.

A variable resistor element 6, functioning as a protective circuit, is monolithically formed with transistor 2 in the substrate. Resistor element 6 comprises a junction type field effect transistor (J-FET) portion 7 and a diode portion 8. Portion 7 is electrically connected to base region 3 while portion 8 is connected in a forward direction to collector region 1. The J-FET portion 7 comprises: a p-type channel region 9 having a low impurity concentration; a p-type source region 10 having a high impurity concentration and formed within channel region 9, a p-type drain region 11, spaced from region 10, having a high impurity concentration and also formed within channel region 9; and an n-type second gate region 12 having a high impurity concentration and also formed within channel region 9 in a manner to cross both source region 10 and drain region 11. Second gate region 12 is used for controlling the thickness of the diffusion layer (i.e., the bottom portion 9a of the channel region immediately under this second gate) and for decreasing the impurity concentration of the diffusion layer. The impurity concentration is higher in the upper portion of the diffusion layer than in its lower portion. A source electrode 13 is formed on the surface of source region 10. A second gate electrode 14 is formed on second gate region 12, and a drain electrode 15 is formed on drain region 11. It should be noted that drain electrode 15 is connected to a base electrode 16 of the bipolar transistor 2.

Diode portion 8 comprises an anode region 17 positioned to provide a pn junction together with the collector region 1 of transistor 2. Collector region 1 also acts as a cathode region of diode portion 8. Diode portion 8 also comprises an anode electrode 18, which is connected to second gate electrode 14 of J-FET portion 7 by use of connector 19.

As shown in FIG. 3, a base current supply terminal B is connected to source electrode 13 of J-FET portion 7. An emitter electrode 20 and a collector electrode (not shown) of the bipolar transistor 6 are respectively connected to a ground terminal E and a load as would normally be done with a single transistor.

In the semiconductor device of the present invention, the voltage between the emitter and collector of the bipolar transistor 2 induces the depletion layer not only in the collector region but also in the bottom portion 9a of channel region 9. The base current and base input resistance of bipolar transistor 2 are controlled by the thickness of the formed depletion layer. It follows that, if a high voltage is applied between the emitter and collector, the thickness of the channel in which base current can flow is decreased by the formed depletion layer resulting in an increased resistance between the source and drain regions. As a result, the base input resistance of bipolar transistor 2 is increased, producing a reduction in base current.

In order not to impair the saturation characteristics of the transistor, it is necessary to properly design the length-to-width ratio of bottom portion 9a. It should be noted that a change in base input resistance relative to a change in emitter-collector voltage depends on: the thickness of the diffusion layer, the depth of second gate region 12 and on the impurity concentration of the diffusion layer. In the embodiment described above, the change in base input resistance relative to emitter-collector voltage is very large. Assuming, for example, a p-type channel region 9 having a depth of 10 $\mu$m and a surface impurity concentration of $5\times10^{16}/cm^3$ and an n-type gate region 12 having a depth of 5 $\mu$m and a high impurity concentration are formed in an n-type substrate of a low impurity concentration (i.e., $5\times10^{13}/cm^3$). In this case, the base input resistance can be changed 100 times or more when a voltage of 800 V is applied between the collector and the emitter.

In view of possible breakdown voltage of the device, it is not desirable to tie the potential of the second gate region 12 with the potential of the source electrode or drain electrode in an attempt to fix the potential of the second gate region 12. In such a case, the collector-base breakdown would occur when the depletion layer in the channel region has expanded to reach the second gate region. Therefore, in accordance with one embodiment of the present invention, gate region 12 is connected to the anode region of the diode portion 8 to fix the potential. If, however, the breakdown voltage of junction 12 and 11 are sufficiently large, there is no need to utilize diode portion 8.

Figure 4:
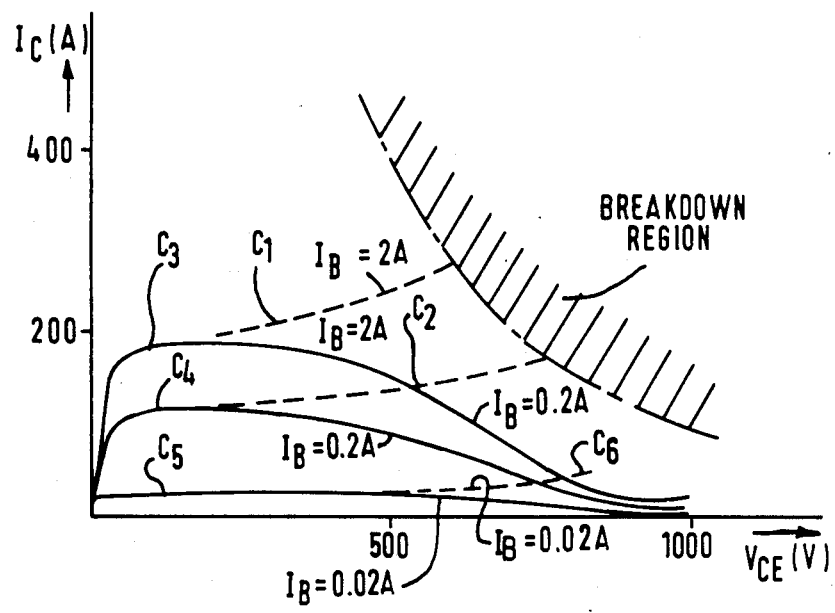
FIG. 4 shows the static characteristics of the semiconductor device of the present invention.

FIG. 4 shows the $I_C$-$V_{CE}$ characteristics of both a semiconductor device designed in accordance with the present invention and a conventional single transistor. The semiconductor device of the present invention has 0.1 ohms of initial base input resistance. Also, the amount of change in resistance during application of the collector voltage is 100 times the original value. Curves $C_3$, $C_4$ and $C_5$ represent the $I_C$-$V_{CE}$ characteristics of a device constructed in accordance with the present invention. Dashed lines $C_1$, $C_2$ and $C_6$ represent the $I_C$-$V_{CE}$ characteristics of a conventional single transistor without an appropriate protection circuit.

Curve $C_1$ shows a flow of collector current of approximately 280 A at a base current $I_B$ of 2 A if a voltage of 600 V is applied between the collector and the emitter due to short-circuiting during operation of the device. As a result, a conventional single transistor not provided with a variable resistor element will be destroyed in several micro-seconds after short-circuiting occurs. In the semiconductor device of the present invention, however, the collector current $I_C$ is held at a low level (e.g., 20 A) at a base current $I_B$ of 2 A, even with the application of a high voltage, such as 800 V, due to an accident occurring during the operation of the device. This protection control can be seen from curve $C_3$. It is clear that the semiconductor device of the instant invention avoids breakdown and maintains its operation since the base current is not interrupted. As can be seen from $C_3$, collector current continues to flow but at a lower level.

It should also be noted that, in the semiconductor device of the present invention, the base current $I_B$ is decreased in accordance with an increase in the emitter-collector voltage. Although the characteristics of the device are changed with a change in base current $I_B$, collector current continues to flow.

Figure 5:
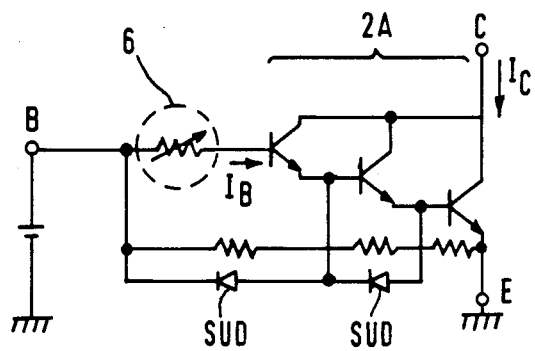
FIG. 5 is a schematic diagram of a semiconductor device according to another embodiment of the present invention.

FIG. 5 shows a semiconductor device according to another embodiment of the present invention. In this embodiment, the technical concept of the present invention is applied to a three stage Darlington transistor. As seen from the drawing, the semiconductor device comprises a bipolar transistor portion 2A formed of a three stage Darlington transistor and a variable resistor element 6 connected in series with the base of a first transistor driving stage in transistor portion 2A. Variable resistor element 6 is similar to the one shown in FIG. 3. The semiconductor device also comprises speed-up diodes (SUDs) as well as a base current supply terminal B and a collector current supply terminal C similar to those shown in FIG. 3.

If a high voltage is applied to the collector of the transistor output stage of transistor portion 2A, the resistance of the channel portion within the resistor element 6 is increased, thereby increasing the base input resistance of transistor portion 2, as previously described with the embodiment of FIG. 3. As a result, the base current $I_B$ is decreased. It follows that the collector current $I_C$ is also decreased for preventing the destruction of portion 2A. It should also be noted that breakdown of transistor portion 2A is prevented even if load short-circuiting occurs as discussed in the embodiment of FIG. 3.

The large power switching semiconductor device of the present invention will avoid breakdown even if a load short-circuiting occurs and, thus, it is protected from destruction. It follows that the present invention provides a semiconductor device with a substantially enlarged safety operation region in the event of short-circuiting. In addition, the power source voltage is not restricted by the protection circuit, thereby making it unnecessary to take additional precautions to stabilize the power source voltage.

In the embodiments described above, the variable resistor element 6 is formed monolithically with transistor 2. The variable resistor element 6 and the transistor 2, however, may be formed in separate chips to thereby provide a hybrid structure.

We claim:

1. A transistor device which will not break down in the event of an accident such as load short circuiting but will continue to operate, said transistor device comprising:
   a bipolar transistor; and
   protection means for protecting said bipolar transistor from being damaged due to the accidental application of a high voltage to the collector of said transistor wherein said protection means consists essentially of a single junction type field effect transistor which is responsive to said high voltage to reduce the base current of said transistor without eliminating said base current thereby maintaining the operation of said transistor while protecting said transistor from breaking down.

2. A transistor device according to claim 1 wherein said bipolar transistor is a bipolar planar transistor formed on a semiconductor substrate.

3. A transistor device according to claim 1 wherein said bipolar transistor is formed on a semiconductor substrate and said junction type field effect transistor is formed on said substrate.

4. A transistor device which will not break down in the event of an accident such as load short circuiting but will continue to operate, said transistor device comprising:
   a bipolar transistor; and
   protection means for protecting said bipolar transistor from being damaged due to the accidental application of a high voltage to the collector of said bipolar transistor wherein said protection means comprises a junction type field effect transistor responsive to said high voltage to reduce the base current of said bipolar transistor without eliminating said base current thereby maintaining the operation of said bipolar transistor while protecting said transistor from breaking down wherein the base of said bipolar transistor is connected to the drain of said field effect transistor and the collector of said bipolar transistor is connected to the gate of said field effect transistor.

5. A transistor device which will not break down in the event of an accident such as load short circuiting but will continue to operate, said transistor device comprising:
   a bipolar transistor; and
   protection means for protecting said bipolar transistor from being damaged due to the accidental application of a high voltage to the collector of said bipolar transistor wherein said protection means comprises a junction type field effect transistor responsive to said high voltage to reduce the base current of said bipolar transistor without eliminating said base current thereby maintaining the operation of said bipolar transistor while protecting said bipolar transistor from breaking down wherein the base of said bipolar transistor is connected to the drain of said field effect transistor and the collector of said bipolar transistor is connected to the gate of said field effect transistor further wherein said field effect transistor comprises a second gate region which crosses the source region and the drain region of said field effect transistor.

6. The transistor device according to claim 5 wherein said second gate region is connected to a substrate by a region of a conductivity type other than the conductivity type of said substrate.

7. A transistor device according to claim 5 wherein said second gate region is connected to a substrate by a diode.

8. A transistor device according to claim 7 wherein said second gate is connected to the anode of said diode.

9. A transistor device which will not break down in the event of an accident such as load short circuiting but will continue to operate, said transistor device comprising:
   a bipolar transistor; and protection means for protecting said bipolar transistor from being damaged due to the accidental application of a high voltage to the collector of said transistor wherein said protection means comprises a junction type field effect transistor and is responsive to said high voltage to reduce the base current of said transistor without eliminating said base current thereby maintaining the operation of said transistor while protecting said transistor from breaking down;

wherein said bipolar transistor is a bipolar planar transistor formed on a semiconductor substrate; and wherein said substrate functions as the gate and the collector of said field effect transistor and said bipolar transistor, respectively.

* * * * *